(12) United States Patent
Park et al.

(10) Patent No.: US 10,978,626 B2
(45) Date of Patent: Apr. 13, 2021

(54) DISPLAY APPARATUS AND MANUFACTURING METHOD THEREOF

(71) Applicant: SAMSUNG ELECTRONICS CO., LTD., Suwon-si (KR)

(72) Inventors: Won Soon Park, Suwon-si (KR); Tack Mo Lee, Suwon-si (KR); Jung Hoon Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/545,146

(22) Filed: Aug. 20, 2019

(65) Prior Publication Data

US 2020/0058834 A1    Feb. 20, 2020

(30) Foreign Application Priority Data

Aug. 20, 2018   (KR) .................. 10-2018-0097032
Jul. 24, 2019   (KR) .................. 10-2019-0089452

(51) Int. Cl.

| H01L 33/54 | (2010.01) |
|---|---|
| H01L 27/12 | (2006.01) |
| H01L 33/56 | (2010.01) |
| H01L 27/15 | (2006.01) |

(52) U.S. Cl.
CPC .......... *H01L 33/54* (2013.01); *H01L 27/1218* (2013.01); *H01L 27/156* (2013.01); *H01L 33/56* (2013.01)

(58) Field of Classification Search
CPC .. H01L 27/32; H01L 27/3237; H01L 27/3293
See application file for complete search history.

(56) References Cited

U.S. PATENT DOCUMENTS

| 2003/0126741 A1* | 7/2003 | Dlugokecki ............ H01L 24/85 29/827 |
|---|---|---|
| 2006/0044490 A1 | 3/2006 | Ichioka et al. |
| 2010/0177259 A1 | 7/2010 | Ichioka et al. |
| 2015/0221712 A1 | 8/2015 | Yu et al. |
| 2017/0033009 A1* | 2/2017 | Scanlan .................. H01L 24/13 |
| 2017/0309698 A1 | 10/2017 | Bower et al. |
| 2017/0359865 A1 | 12/2017 | Kim et al. |
| 2019/0012956 A1* | 1/2019 | Li .......................... H05B 45/00 |

OTHER PUBLICATIONS

Communication (PCT/ISA/210) dated Dec. 16, 2019 by the International Searching Authority in counterpart International Patent Application No. PCT/KR2019/010405.

* cited by examiner

*Primary Examiner* — Jae Lee
(74) *Attorney, Agent, or Firm* — Sughrue Mion, PLLC

(57) ABSTRACT

A display apparatus includes a plurality of unit modules; and a cover configured to support the plurality of unit modules. Each of the plurality of unit modules includes: a substrate; a plurality of inorganic light emitting diodes provided on a mounting surface of the substrate; and an encapsulation layer formed on the mounting surface of the substrate to cover the plurality of inorganic light emitting diodes and the mounting surface of the substrate. The encapsulation layer includes a viscoelastic material having varying viscoelasticity based on temperature being applied to the viscoelastic material.

16 Claims, 16 Drawing Sheets

DISPLAY APPARATUS AND MANUFACTURING METHOD THEREOF

CROSS-REFERENCE TO RELATED APPLICATIONS

This application is based on and claims priority under 35 U.S.C. § 119 to Korean Patent Application No. 10-2018-0097032 filed on Aug. 20, 2018, and Korean Patent Application No. 10-2019-0089452 filed on Jul. 24, 2019, in the Korean Intellectual Property Office, the disclosures of which are incorporated by reference herein in their entireties.

BACKGROUND

1. Field

The disclosure relates to a display apparatus capable of directly displaying an image by coupling a plurality of modules, each of the plurality of modules including a self-emissive inorganic light emitting diode is mounted on a substrate, to one another and a method of manufacturing the same.

2. Description of Related Art

A display apparatus is a type of an output device which visually displays information such as characters and figures, and images. The demand for high luminance, high resolution, large size, high efficiency, and low power display apparatuses is continuously increasing. Accordingly, an Organic Light Emitting Diode (OLED) panel has been becoming more popular as a new display apparatus to replace a Liquid crystal display (LCD). However, the OLED panel has some limitations such as the high price caused by a low production yield rate, the low reliability with a large size panel, and the durability that is affected by external surrounding such as water.

Considering the known limitation of the LCD panel and the OLED panel and to supplement the LCD panel and the OLED panel, a study of developing a new technology for manufacturing a panel by directly mounting an inorganic light emitting diode emitting red (R), green (G) and blue (B) light on a substrate has been conducted.

The inorganic light emitting display technology has its own challenges in transferring an inorganic light emitting diode in a very small size (having a size of several micrometers to several hundreds of micrometers) from a wafer to a substrate. In addition, even after the inorganic light emitting diode is mounted, there are still challenges in physically protecting the inorganic light emitting diode without affecting the display with the optical distortion and the optical loss. Even further, there is a need for a technology that can improve image quality in addition to simply protecting the image.

SUMMARY

Therefore, it is an aspect of the present disclosure to provide an encapsulation technology capable of physically protecting inorganic light emitting diodes and improving an image quality after transferring the inorganic light emitting diodes having a size of several micrometers to several hundreds of micrometers from a wafer to a substrate, a manufacturing method of a display apparatus including the same, and a display apparatus according to the same.

It is another aspect of the present disclosure to provide an encapsulation technology capable of preventing a seam between unit modules adjacent to each other from being seen when a large screen is implemented by arranging unit modules in a matrix, a manufacturing method of a display apparatus including the same, and a display apparatus according to the same.

It is another aspect of the present disclosure to provide an encapsulation technology capable of easily repairing a defective inorganic light emitting diode even after encapsulating of a plurality of inorganic light emitting diodes, and a repair method of a display apparatus including the same.

Additional aspects of the present disclosure will be set forth in part in the description which follows and, in part, will be obvious from the description, or may be learned by practice of the present disclosure.

In accordance with an aspect of the disclosure, a method of manufacturing a display apparatus includes mounting a plurality of inorganic light emitting diodes on a mounting surface of a substrate; forming an encapsulation layer comprising a viscoelastic material on the mounting surface of the substrate to cover the plurality of inorganic light emitting diodes and the mounting surface of the substrate; assembling a plurality of unit modules including a first unit module and a second unit module to be adjacent to each other, each of the plurality of unit modules comprising the substrate, the plurality of inorganic light emitting diodes, and the encapsulation layer, the first unit module and the second unit module having a gap provided between the first and second unit modules; and changing viscoelasticity of a first encapsulation layer of the first unit module and a second encapsulation layer of the second unit module to visually hide the seam.

The mounting the plurality of inorganic light emitting diodes may include: separating he plurality of inorganic light emitting diodes from a wafer; and transferring the plurality of inorganic light emitting diodes separated from the wafer onto the substrate.

A shorter side of each of the plurality of inorganic light emitting diodes may have a size of 100 μm or less.

The viscoelastic material may include at least one of ethylene based polymers, acetate based polymers, ethylene vinyl acetate based polymers, olefin based polymers, or acrylic based polymers.

Based on the viscoelastic material being heated and reaching a predetermined temperature, the viscoelasticity of the viscoelastic material may be lowered and the viscoelastic material may gain fluidity.

The forming the encapsulation layer may include: forming the viscoelastic material in a film or a sheet; and laminating the film or the sheet onto the substrate.

The forming the encapsulation layer may include laminating the viscoelastic material to the substrate while applying heat and pressure in a vacuum state.

The forming the encapsulation layer may include placing a compensation layer on the encapsulation layer to flatten the encapsulation layer.

The method may further include removing the compensation layer after the encapsulation layer is cured.

The substrate may include: a glass substrate; and a thin film transistor (TFT) layer formed on the glass substrate and configured to drive the plurality of inorganic light emitting diodes.

The assembling the plurality of unit modules may include arranging the plurality of unit modules in a matrix.

In accordance with another aspect of the disclosure, a display apparatus includes a plurality of unit modules; and a cover configured to support the plurality of unit modules. Each of the plurality of unit modules may include: a substrate; a plurality of inorganic light emitting diodes provided on a mounting surface of the substrate; and an encapsulation layer formed on the mounting surface of the substrate to cover the plurality of inorganic light emitting diodes and the mounting surface of the substrate. The encapsulation layer may include a viscoelastic material having varying viscoelasticity based on temperature being applied to the viscoelastic material.

Based on the viscoelastic material being heated and reaching a predetermined temperature, the viscoelasticity of the viscoelastic material may be lowered and the viscoelastic material may gain fluidity.

The viscoelastic material may include at least one of ethylene based polymers, acetate based polymers, ethylene vinyl acetate based polymers, olefin based polymers or acrylic based polymers.

The substrate may include: a glass substrate; and a thin film transistor (TFT) layer formed on the glass substrate and configured to drive the plurality of inorganic light emitting diodes.

The plurality of unit modules may be arranged in a matrix.

A seam between the plurality of unit modules adjacent to each other may be visually hidden by applying heat to the encapsulation layer of the plurality of unit modules.

The display apparatus may further include a compensation layer formed on the encapsulation layer to improve flatness of the encapsulation layer.

The display apparatus may further include a frame arranged between the plurality of unit modules and the cover and coupled to the plurality of unit modules In accordance with another aspect of the disclosure, a display apparatus includes a plurality of unit modules; and a cover configured to support the plurality of unit modules. Each of the plurality of unit modules may include: a substrate; at least one inorganic light emitting diode package mounted on a mounting surface of the substrate, the at least one inorganic light emitting diode package including: an inorganic light emitting diode; and a molding resin configured to individually surround the inorganic light emitting diode; and an encapsulation layer formed on the mounting surface of the substrate to cover the at least one inorganic light emitting diode package and the mounting surface of the substrate. The encapsulation layer may include a viscoelastic material having varying viscoelasticity based on temperature being applied to the viscoelastic material.

In accordance with another aspect of the disclosure, a display apparatus includes a first unit module including: a first substrate; a plurality of first inorganic light emitting diodes provided on a first mounting surface of the first substrate; and a first encapsulation layer formed on the first mounting surface of the first substrate to cover the plurality of first inorganic light emitting diodes and the first mounting surface of the first substrate; a second unit module, the first unit module and the second unit module being adjacent to each other and having a gap therebetween, the second unit module including: a second substrate; a plurality of second inorganic light emitting diodes provided on a second mounting surface of the second substrate; and a second encapsulation layer formed on the second mounting surface of the second substrate to cover the plurality of second inorganic light emitting diodes and the second mounting surface of the second substrate; and a cover configured to support the first and second unit modules. The seam between the first unit module and the second unit module is visually hidden by varying viscoelasticity of each of the first and second encapsulation layers.

Based on a viscoelastic material of each of the first and second encapsulation layers being heated and reaching a predetermined temperature, the viscoelasticity of each of the first and second encapsulation layers may be lowered and the viscoelastic material of each of the first and second encapsulation layers may gain fluidity.

The viscoelastic material of each of the first and second encapsulation layers may include at least one of ethylene based polymers, acetate based polymers, ethylene vinyl acetate based polymers, olefin based polymers or acrylic based polymers.

25. The display apparatus may further include a compensation layer formed on the first and second encapsulation layers to improve flatness of the first and second encapsulation layers.

BRIEF DESCRIPTION OF THE DRAWINGS

The above and/or other aspects of the disclosure will become apparent and more readily appreciated from the following description of embodiments, taken in conjunction with the accompanying drawings of which.

DETAILED DESCRIPTION

Figure 1:
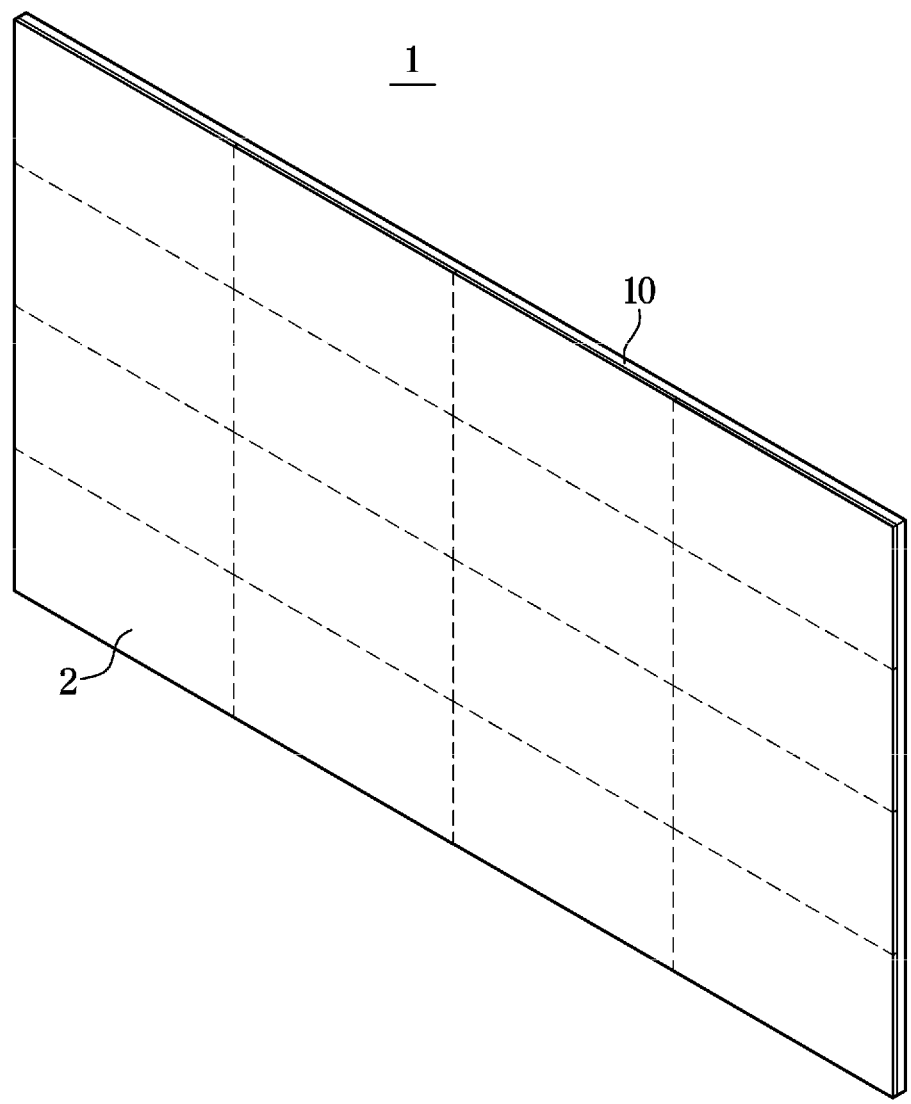
FIG. 1 is a perspective view of a display apparatus according to an embodiment.

Embodiments described in the disclosure and configurations shown in the drawings are merely examples of the disclosure, and may be modified in various different ways at the time of filing of the present application to replace the embodiments and drawings of the disclosure.

The singular forms "a," "an" and "the" are intended to include the plural forms as well, unless the context clearly indicates otherwise. The shape and size of the elements in the figures may be exaggerated for clarity.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Figure 2:
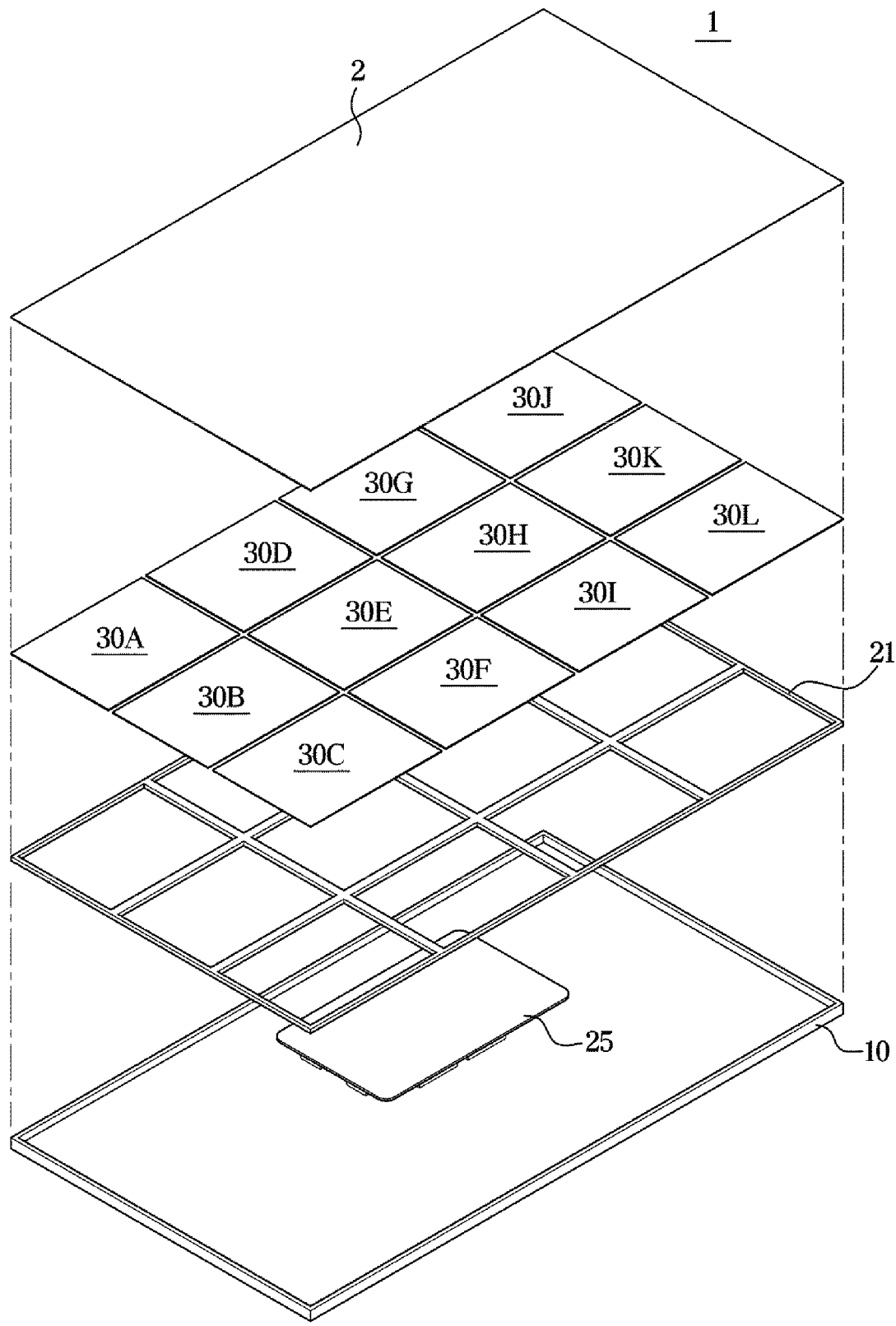
FIG. 2 is an exploded view of components of a display apparatus according to an embodiment.

The present disclosure will be described more fully hereinafter with reference to the accompanying drawings FIG. 1 is a perspective view of a display apparatus 1 according to an embodiment of the disclosure. FIG. 2 is an exploded view of components of a display apparatus 1 according to an embodiment of the disclosure.

Referring to FIGS. 1 and 2, a display apparatus 1 is an output device for displaying information and data in the form of characters, features, graphics, and images. For example, the display apparatus may be implemented as a television (TV), a personal computer (PC), a mobile, and a digital signage. The display apparatus may be installed on the ground by a stand (not shown) or may be installed on a wall.

According to an embodiment, as shown in FIG. 2, the display apparatus 1 may include a plurality of unit modules 30A~30L displaying an image, a frame 21 supporting the plurality of unit modules 30A~30L, and a rear cover 10 covering a rear surface of the frame 21. The rear cover 10 may form a rear surface of the display apparatus 1.

The plurality of unit modules 30A~30L may be arranged in an M×N matrix in the up, down, left, and right directions so as to be adjacent to one another. According to an embodiment, twelve (12) unit modules 30A~30L are installed on the frame 21 in the form of a 4×3 matrix, but the number and the types of arrangement of a plurality of unit modules are not limited thereto. Therefore, the number and the types of arrangement of the plurality of unit modules may be modified based on the design intent.

The plurality of unit modules 30A~30L may be installed on the frame 21 through various known methods such as a magnetic force using a magnet or a mechanical fitting structure.

The display apparatus 1 may further include a control board 25 for driving the plurality of unit modules 30A~30L and a power supply device (not shown) for supplying power to the plurality of unit modules 30A~30L.

The plurality of unit modules 30A~30L may be planar or curved. Furthermore, the curvature thereof may vary according to the design intent.

A cover glass 2 configured to protect and support the plurality of unit modules 30A~30L may be attached to the front surface of each of the plurality of unit modules 30A~30L. Between the cover glass 2 and the plurality of unit modules 30A~30L, an optical film (not shown) configured to improve optical performance may be provided. For example, a circular polarizing film, a linear polarizing film, a retardation film, AG/LR/AR/HC film, and a Neutral Density (ND) film, which are to improve the image quality, may be used alone as the optical film or alternatively, two or more the above-described films of them may be laminated and used as the optical film.

Figure 3:
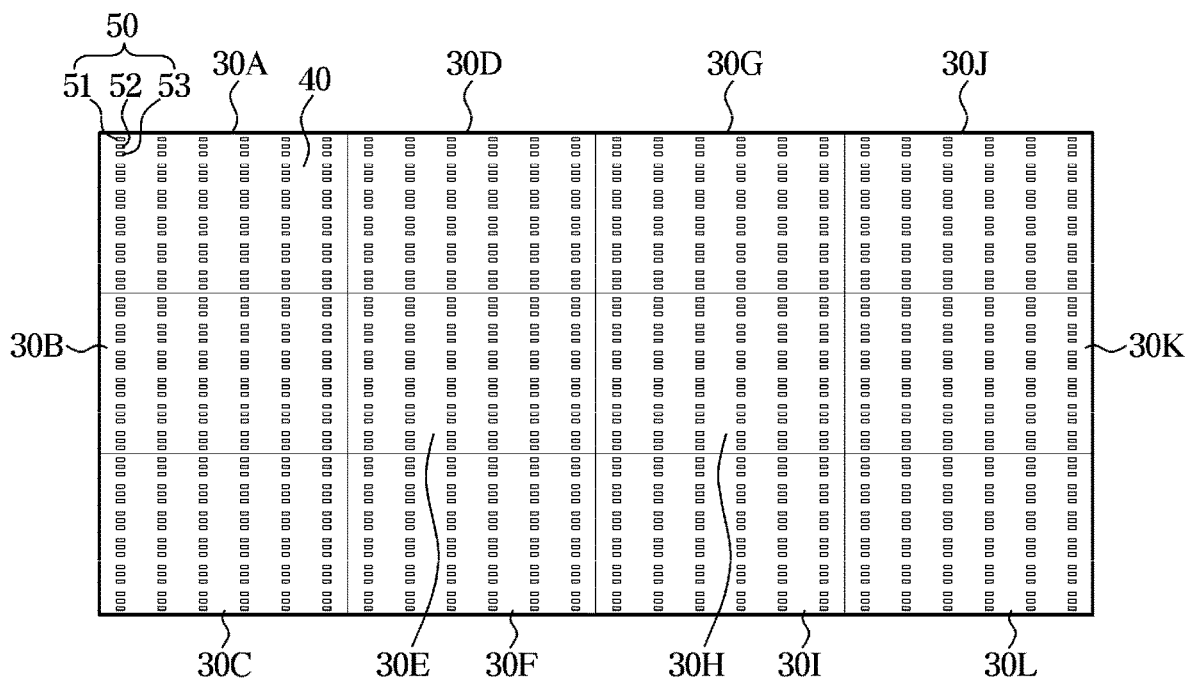
FIG. 3 is a front view illustrating a state in which a plurality of unit modules is arranged in a matrix (an encapsulation layer is omitted) according to an embodiment.
Figure 4:
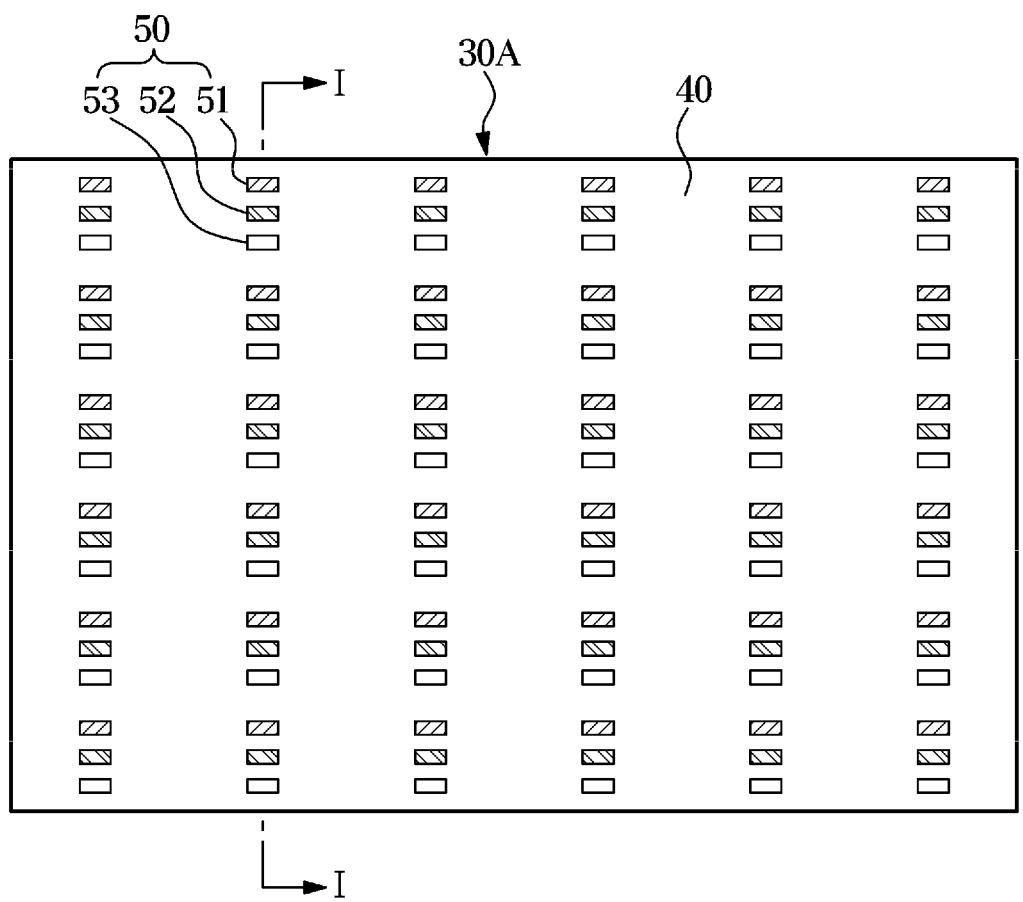
FIG. 4 is a front view of a single unit module (an encapsulation layer is omitted) according to an embodiment.
Figure 5:
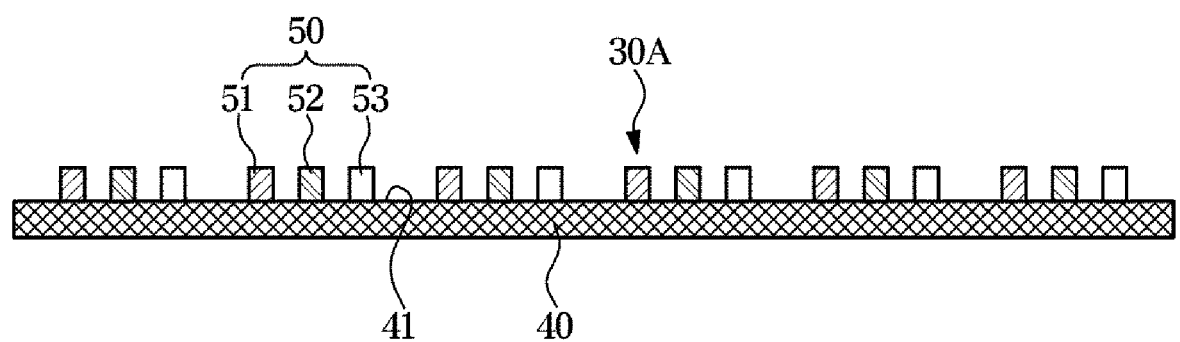
FIG. 5 is a cross-sectional view of a single unit module according to an embodiment of the disclosure, which is taken along the line I-I in FIG. 4 (the encapsulation layer is omitted).
Figure 7:
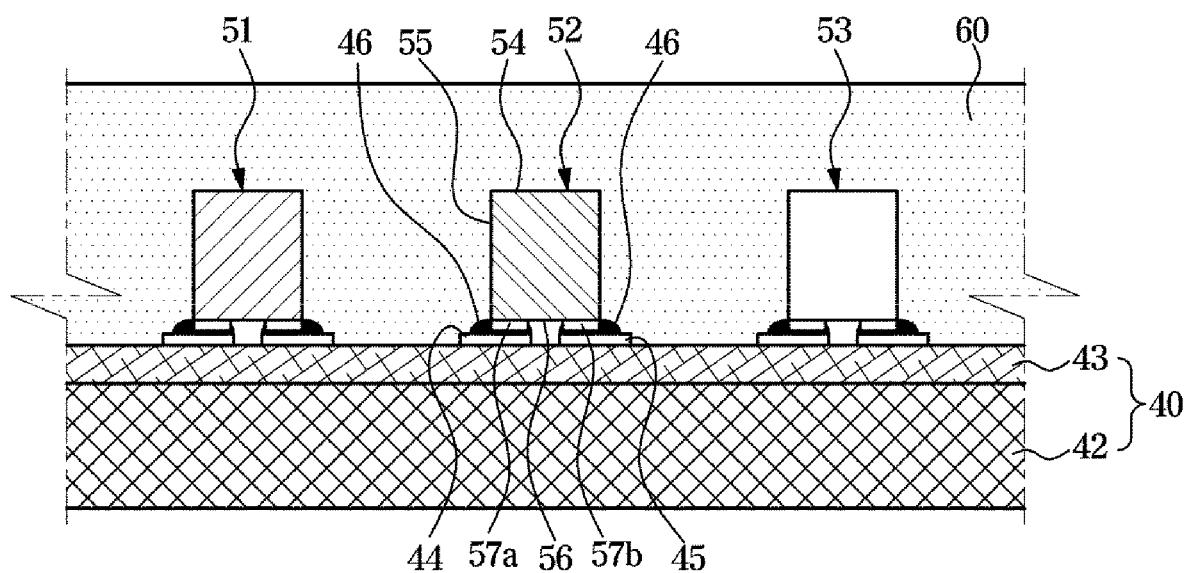
FIG. 7 is a view of a mounting structure of an inorganic light emitting diode according to an embodiment.

FIG. 3 is a front view illustrating a state in which a plurality of unit modules 30A~30L are arranged in a matrix according to an embodiment of the disclosure. FIG. 4 is a front view of a unit module 30A of the plurality of unit modules 30A~30L according to an embodiment of the disclosure. FIG. 5 is a cross-sectional view of a single unit module according to an embodiment of the disclosure, which is taken along the line I-I in FIG. 4. In FIGS. 3-5, an encapsulation layer is omitted. FIG. 7 is a view illustrating a mounting structure of an inorganic light emitting diode according to an embodiment of the disclosure.

Referring to FIGS. 3 to 5, and FIG. 7, each of the plurality of unit modules 30A~30L may include a substrate 40 and a plurality of inorganic light emitting diodes 50 mounted on a mounting surface 41 of the substrate 40.

The substrate 40 may be formed of a material such as polyimide (PI), FR4, and glass. On the mounting surface 41 of the substrate 40, a substrate electrode 44 and 45, to which the plurality of inorganic light emitting diodes 50 are electrically connected, may be formed.

The substrate 40 may include a base substrate 42 and a thin film transistor (TFT) layer 43 formed on the base substrate 42 to drive an inorganic light emitting diode 50 of the plurality of inorganic light emitting diodes 50. The base substrate 42 may include a glass substrate. That is, the substrate 40 may include a chip on glass (COG) type substrate.

The inorganic light emitting diode 50 may be formed of an inorganic material. Therefore, the inorganic light emitting diode 50 may have increased durability and a longer lifetime in comparison with the organic light emitting diode (OLED), which is based on organic materials, and the inorganic light emitting diode 50 may have the power efficiency being several times greater than that of the OLED.

The plurality of inorganic light emitting diodes 50 may include a red inorganic light emitting diode 51, a green inorganic light emitting diode 52, and a blue inorganic light emitting diode 53. The plurality of inorganic light emitting diodes 50 may be formed by mounting a series of the red inorganic light emitting diode 51, the green inorganic light emitting diode 52 and the blue inorganic light emitting diode 53 as a unit, on the substrate 40 as illustrated in, for example, FIG. 5. The red inorganic light emitting diode 51, the green inorganic light emitting diode 52 and the blue inorganic light emitting diode 53 may together form a single pixel.

The red inorganic light emitting diode 51, the green inorganic light emitting diode 52 and the blue inorganic light emitting diode 53 may be arranged at a predetermined interval in a row as illustrated in the drawings, but it may be arranged in different arrangements.

The plurality of inorganic light emitting diodes 50 may be picked up from a source wafer and transferred onto the substrate 40. The plurality of inorganic light emitting diodes 50 may be picked up and transferred through an electrostatic method using an electrostatic head, a stamp bonding method using an elastic polymer such as polydimethylsiloxane (PDMS) or silicon (Si) as a head, or a laser ablation transfer. A width, a length, and a height of each of the plurality of inorganic light emitting diodes 50 may have a size of several micrometers to several hundreds of micrometers, and a shorter side of a width and a length (in a plan view) of a micro inorganic light emitting diode may have 100 µm or less in its size The plurality of inorganic light emitting diodes 50 may include a first diode electrode 57a, and a second diode electrode 57b, and may be formed in the form of a flip chip in which the first diode electrode 57a and the second diode electrode 57b are arranged on a side opposite to a light emitting direction of the plurality of inorganic light emitting diodes 50. That is, the first diode electrode 57a and the second diode electrode 57b may be formed on a bottom surface 56 of the inorganic light emitting diode 50. The first and second diode electrodes 57a and 57b of each of the plurality of inorganic light emitting diodes 50 may be connected to the substrate electrodes 44 and 45 of the substrate 40 through soldering 46. Alternatively, the first diode electrode 57a and the second diode electrode 57b of the inorganic light emitting diode 50 may be connected to the substrate electrodes 44 and 45 of the substrate 40 through an anisotropic conductive film including fine conductive particles.

Further, the inorganic light emitting diode 50 may be a lateral type or a vertical type, and may be connected to the substrate electrodes 44 and 45 through a wire.

Figure 6:
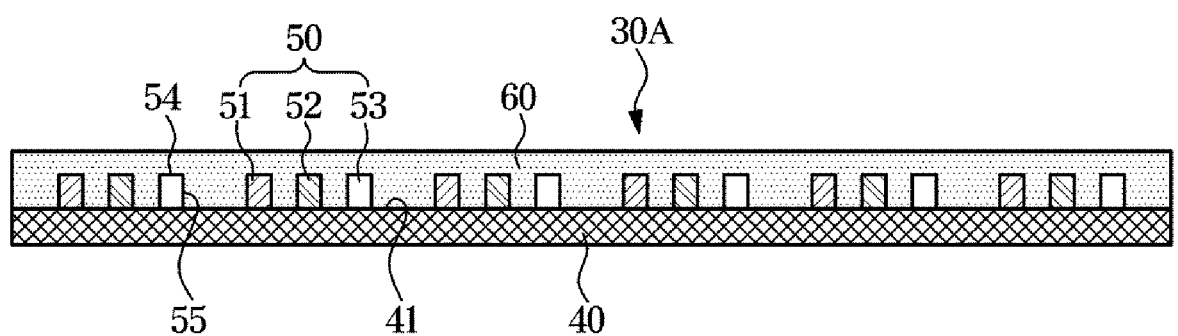
FIG. 6 is a cross-sectional view of a unit module on which the encapsulation layer is formed according to an embodiment.

FIG. 6 is a cross-sectional view of a unit module 30A (of a plurality of unit modules 30A~30L) on which an encapsulation layer is formed according to an embodiment of the disclosure.

Referring to FIGS. 6 and 7, after the plurality of inorganic light emitting diodes 50 are mounted on the substrate 40, an encapsulation layer 60 may be formed on the substrate 40 to physically protect the plurality of inorganic light emitting diodes 50 without causing optical distortion.

The encapsulation layer of the related art is formed of a transparent molding material such as epoxy or silicon, or a tackifier or an adhesive such as Optically Clear Adhesive (OCA) or Optically Clear Resin (OCR).

According to an embodiment, as shown in FIG. 6, the encapsulation layer 60 includes viscoelastic materials, which have the viscoelasticity and the degree of curing which varies according to changes in the temperature or the pressure, so as to physically protect the inorganic light emitting diodes 50 sufficiently as well as improving the image quality.

The viscoelastic material in the encapsulation layer 60 may include at least one of ethylene based polymers, acetate based polymers, ethylene vinyl acetate based polymers, olefin based polymers or acrylic based polymers.

When the viscoelastic material the encapsulation layer 60 is heated and reaches a predetermined temperature, the viscoelasticity thereof may be lowered and the viscoelastic material may have the fluidity. The application of heat to the viscoelastic material may be performed by using either ultraviolet rays or infrared rays. The temperature at which the viscoelastic material has the fluidity may be from about 80° C. to about 120° C., but is not limited thereto. When the temperature of the viscoelastic material exceeds 120° C., the viscoelasticity may increase again and the viscoelastic material may be cured. Other than applying the heat to the viscoelastic material, the viscoelastic material may be cured by adding hardeners thereto.

The viscoelastic material may have a refractive index between 0.5 and 1.8, and the refractive index may be controlled by using polymer particles such as fillers and beads.

The viscoelastic material may include a material such as pigment or dye showing color. Particularly, the viscoelastic material may include a material of black color. By adjusting black, it is possible to control the transmittance as well as brightness and reflectance according to transmittance.

For example, the viscoelastic material may include a black organic material, a black inorganic material and a black metal such as a carbon black, a polyene-based pigment, an azo-based pigment, an azomethine-based pigment, a diimmonium-based pigment, a phthalocyanine-based pigment, a quinone-based pigment, an indigo-based pigment, a thioindigo-based pigment, a dioxadin-based pigment, a quinacridone-based pigment, an isoindolinone-based pigment, a metal oxide, a metal complex, and an aromatic hydrocarbon.

The encapsulation layer 60 may be formed by laminating a viscoelastic material onto the substrate 40 through a lamination process.

That is, the encapsulation layer 60 may be formed by forming the viscoelastic material in the form of a film or a sheet having a uniform thickness and laminating the viscoelastic material onto the substrate 40. In a vacuum state, heat and pressure may be applied when the viscoelastic material adheres onto the substrate 40. The lamination process may allow a thickness of the encapsulation layer to be uniform and may prevent the generation of the bubble in the encapsulation layer 60, thereby improving the image quality of the display apparatus.

The encapsulation layer 60 may be formed to surround an outer surface including an upper surface 54 and side surfaces 55 of each of the plurality of inorganic light emitting diodes 50. The encapsulation layer 60 may be formed to cover the entire area of the mounting surface 41 of the substrate 40 so as to cover all the inorganic light emitting diodes 50 mounted on the substrate 40. That is, the encapsulation layer 60 may be formed in the entire area of the mounting surface 41 of the substrate 40 so as to have a size corresponding to the size of the substrate 40. Also, as will be described later, it is appropriate that the encapsulation layer 60 has a size corresponding to the size of the substrate 40 so that the seams between the plurality of adjacent unit modules are visually and effectively removed.

Figure 8:
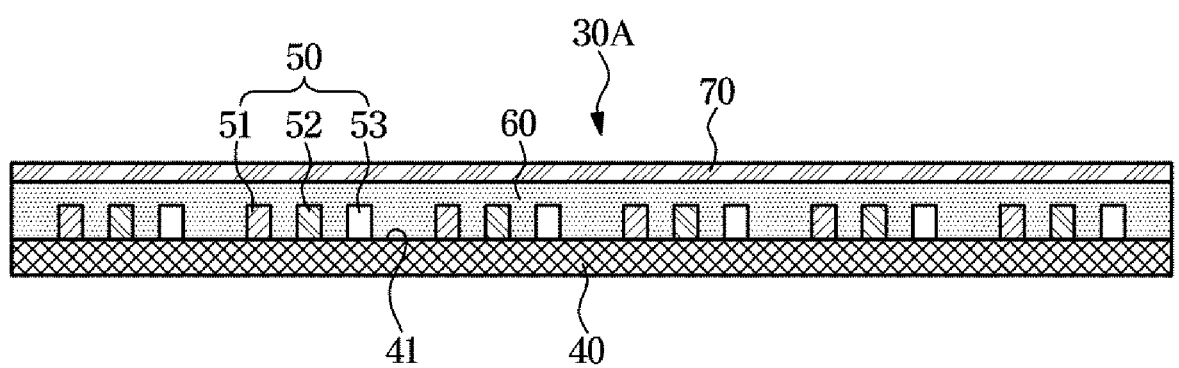
FIG. 8 is a view of a unit module, on which a compensation layer is formed to improve a flatness of the encapsulation layer upon forming the encapsulation layer according to an embodiment.

FIG. 8 is a view of a unit module 30A (of a plurality of unit modules 30A~30L), on which a compensation layer 70 is formed to improve a flatness of the encapsulation layer 60 upon forming the encapsulation layer 60 according to an embodiment of the disclosure.

Referring to FIG. 8, the formation of the encapsulation layer 60 may include placing a compensation layer 70 over the encapsulation layer 60 including the viscoelastic material so that the encapsulation layer 60 is more flatly formed. That is, after the compensation layer 70 is placed on the encapsulation layer 60 including the viscoelastic material, the encapsulation layer 60 and the compensation layer 70 may be laminated to each other, which is to make the encapsulation layer 60 flat. The compensation layer 70 may include a film or a glass. Accordingly, the encapsulation layer 60 may be formed to have an overall uniform thickness.

A parting agent may be arranged between the compensation layer 70 and the encapsulation layer 60 and thus it is possible to remove the compensation layer 70 after the encapsulation layer 60 is cured.

When the film or the glass remains, the film may include optical film such as cellulose triacetate (TAC), polyethylene terephthalate (PET), and cyclic olefin polymer (COP), which are used in a display apparatus of the related art. These films may improve polarization, phase, transmission, reflection and haze. The thickness of the film may be in the range of 3 µm to 500 µm. The thickness of the glass may be in the range of 1 µm to 7000 µm. The thicknesses of the film and the glass may be selected to adjust the boundary between the plurality of unit modules 30A~30L.

Figure 9:
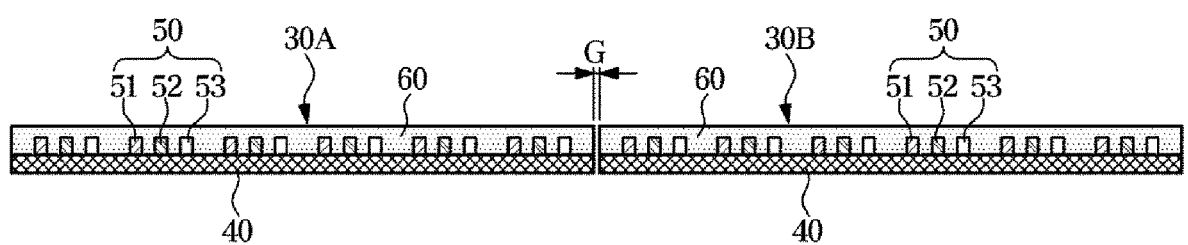
FIG. 9 is a view of a plurality of unit modules adjacent to each other according to an embodiment.
Figure 10:
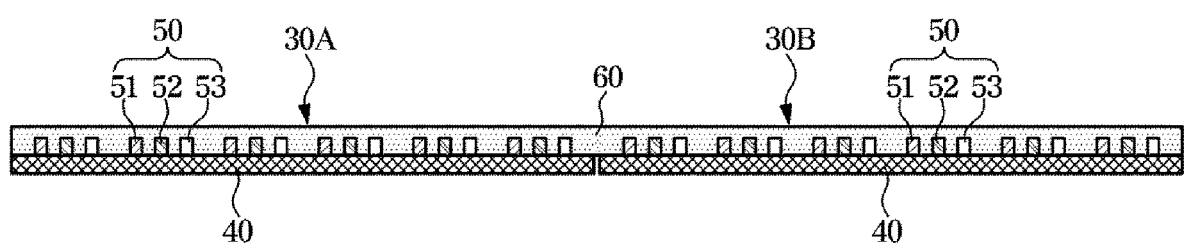
FIG. 10 is a view of a display apparatus, in which a seam between the plurality of unit modules is visually removed by applying heat to the encapsulation layer according to an embodiment.

FIG. 9 is a view of a plurality of unit modules 30A~30L adjacent to each other according to an embodiment of the disclosure. FIG. 10 is a view of a display apparatus 1, in which a seam between the plurality of unit modules 30A~30L is visually hidden by applying heat to the encapsulation layer, according to an embodiment of the disclosure. Seam is what is visually recognized by physical gap between the plurality of unit modules.

As illustrated in FIG. 9, fine intervals may be formed amongst the plurality of unit modules 30A~30L which are adjacent to each other. For example, a gap may be formed between the adjacent unit modules 30A and 30B. Therefore, seam can be visually recognized by the gap.

In order to improve image quality, it is needed to visually remove the seam G. According to the embodiment of the disclosure, after assembling the adjacent unit modules 30A and 30B adjacent to each other, heat may be applied to the encapsulation layer 60 of the adjacent unit modules 30A and 30B and thus the seam G between the adjacent unit modules 30A and 30B adjacent to each other may be hidden.

When the heat is applied to the surface seam of the adjacent unit modules 30A and 30B, the viscoelastic material contained in the encapsulation layer 60 is lowered in viscoelasticity and gains fluidity and then sticks together while flowing, thereby visually removing the seam G. That is, the seam G may be hidden. After the seam G is visually removed, the viscoelastic material may be further heated or a hardener may be added, thereby curing the encapsulation layer 60 again.

Figure 14:
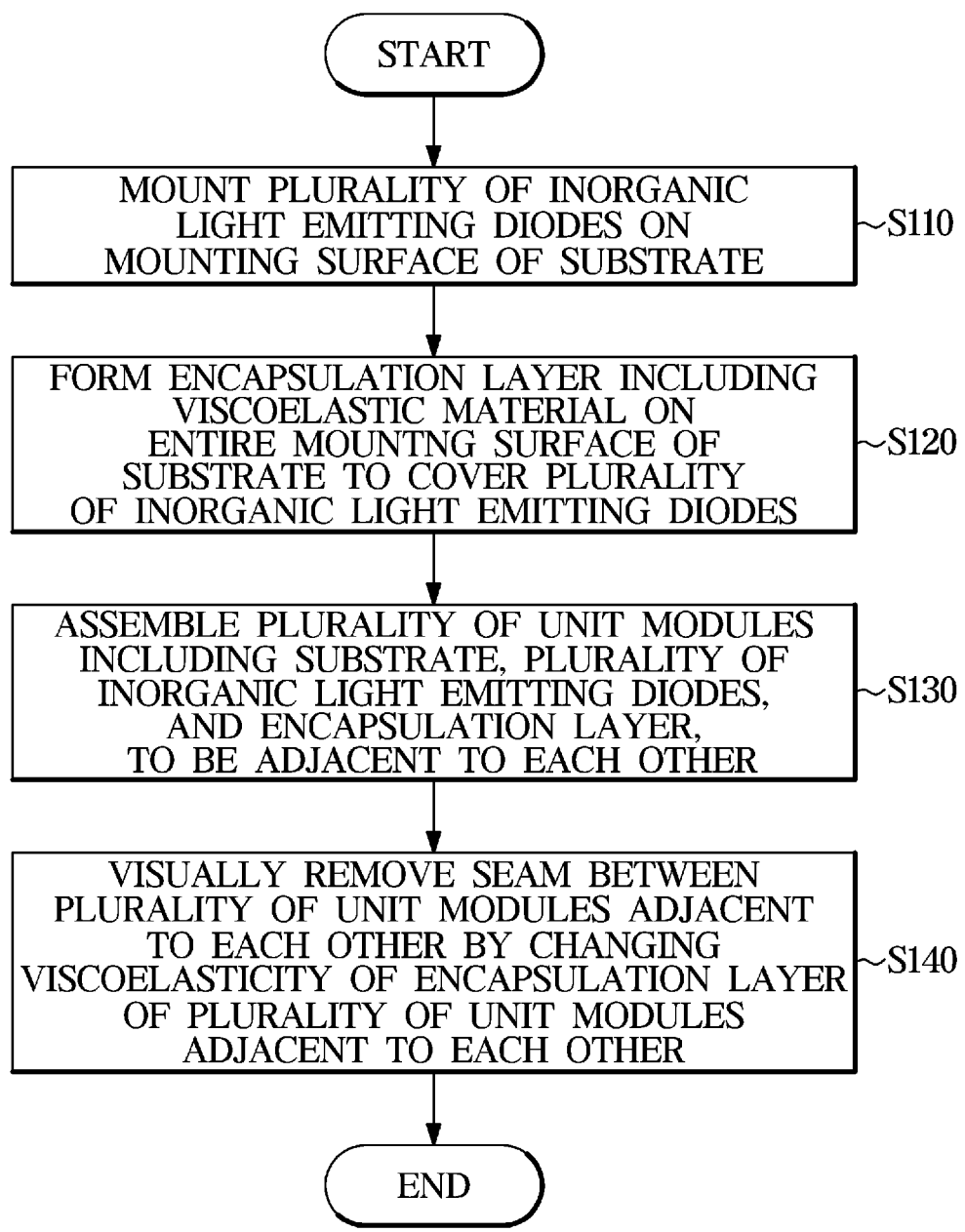
FIG. 14 is a flow chart illustrating a manufacturing method of a display apparatus according to an embodiment.

FIG. 14 is a flow chart illustrating a method of manufacturing a display apparatus 1 according to an embodiment of the disclosure.

Referring to FIG. 14, a method of manufacturing a display apparatus according to an embodiment of the disclosure will be described below.

First, a plurality of inorganic light emitting diodes 50 are mounted on a substrate 40 (S110).

Next, an encapsulating layer 60 including a viscoelastic material is formed on the substrate 40 so as to cover the plurality of inorganic light emitting diodes 50 (S120).

Next, the plurality of unit modules, each including the substrate 40, the plurality of inorganic light emitting diodes 50, and the encapsulation layer 60, are prepared and assembled to be adjacent to each other (S130).

By applying heat to the surface boundary of the plurality of the unit modules adjacent to each other, the seam between the plurality of unit modules adjacent to each other is visually hidden (S140).

Figure 11:
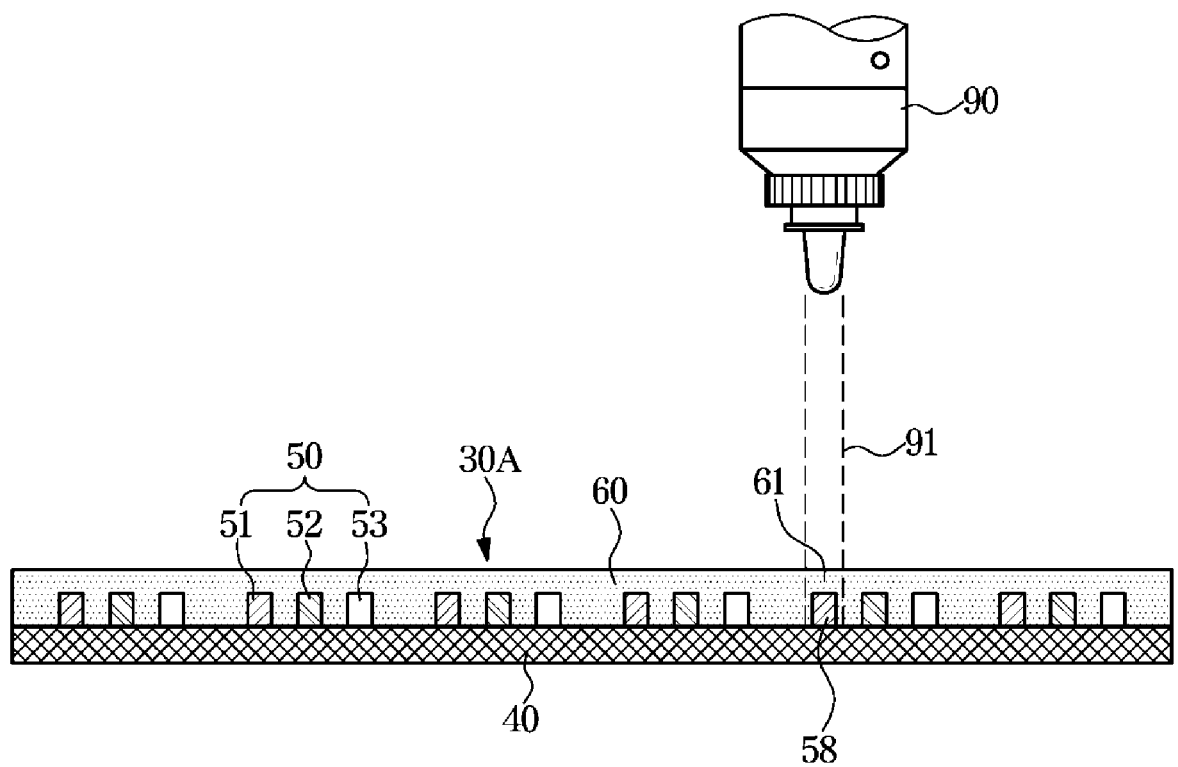
FIG. 11 is a view illustrating an operation of removing a partial region of the encapsulation layer, which is positioned on an upper surface of a defective inorganic light emitting diode according to an embodiment.
Figure 12:
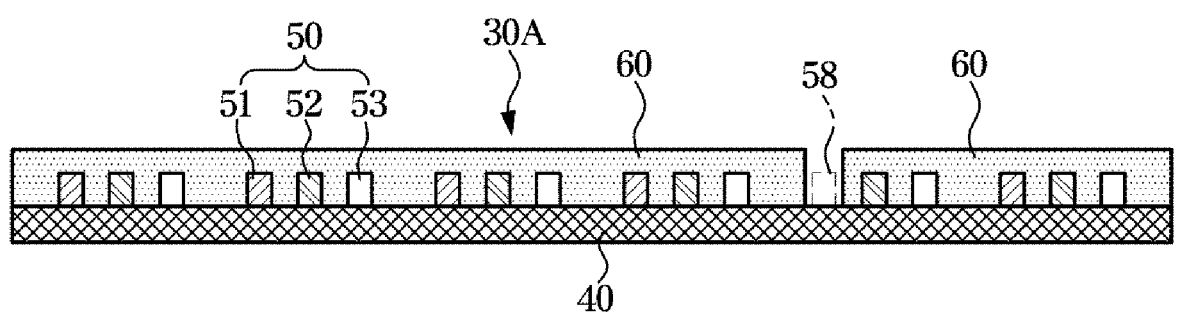
FIG. 12 is a view illustrating a state in which the partial region of the encapsulation layer, which is positioned on an upper surface of a defective inorganic light emitting diode, is removed according to an embodiment.
Figure 13:
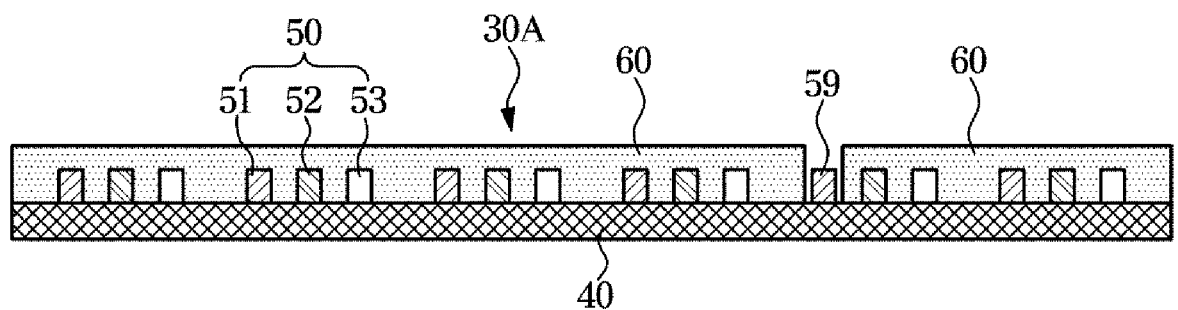
FIG. 13 is a view illustrating a state in which the defective inorganic light emitting diode is replaced with a repair inorganic light emitting diode according to an embodiment.
Figure 15:
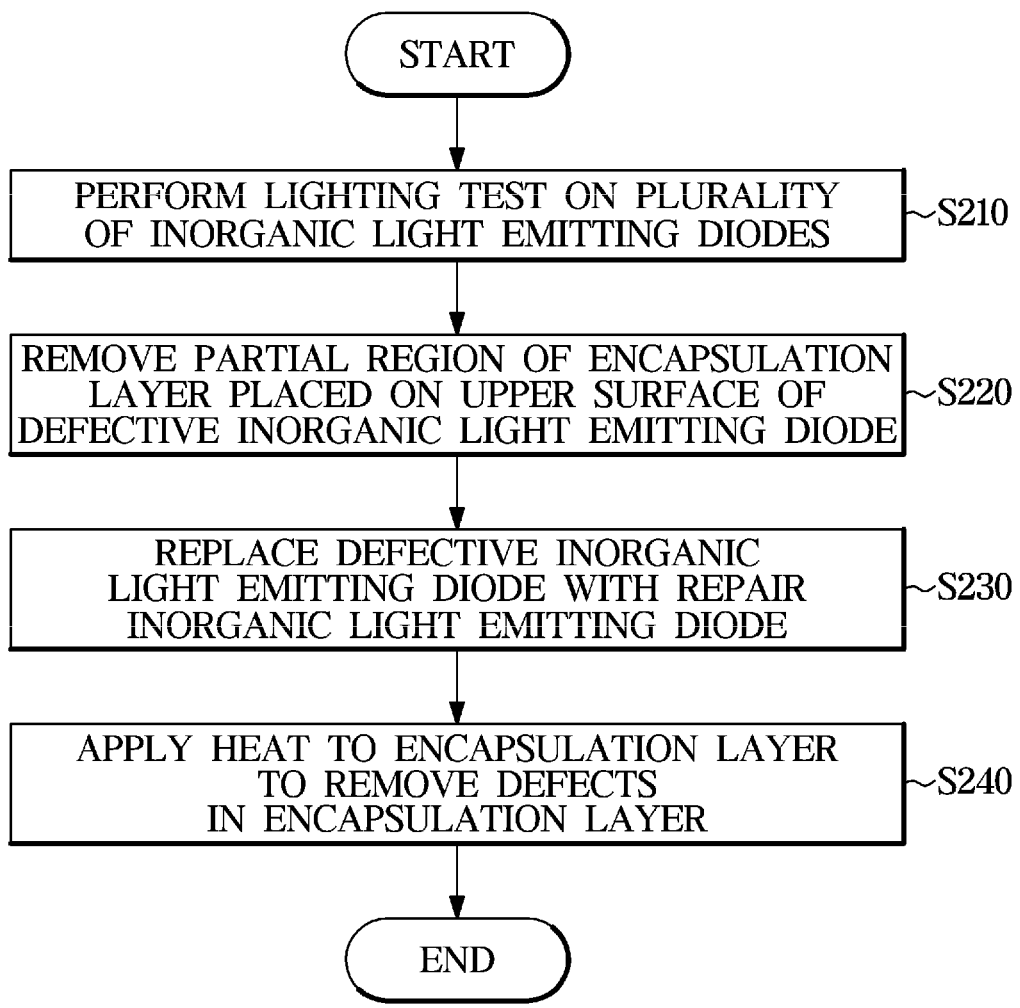
FIG. 15 is a flow chart illustrating a repair method of a display apparatus according to an embodiment.

FIG. 11 is a view illustrating an operation of removing a partial region 61 of the encapsulation layer 60, which is positioned on an upper surface of a defective inorganic light emitting diode 58 according to an embodiment of the disclosure. FIG. 12 is a view illustrating a state in which the partial region 61 of the encapsulation layer 60, which is positioned on an upper surface of a defective inorganic light emitting diode 58, is removed according to an embodiment of the disclosure. FIG. 13 is a view illustrating a state in which a defective inorganic light emitting diode 58 is replaced with a replacement inorganic light emitting diode 59 according to an embodiment of the disclosure. FIG. 15 is a flow chart illustrating a method of repairing a display apparatus 1 according to an embodiment of the disclosure.

Hereinafter, a description will be provided with reference to FIGS. 11 to 13 and 15. Because the encapsulation layer 60 includes the viscoelastic material, a display apparatus 1 according to an embodiment of the disclosure may easily replace a defective inorganic light emitting diode 58 even after the encapsulation layer 60 is formed on a plurality of inorganic light emitting diodes 50.

That is, when a defective inorganic light emitting diode 58, which is failed to be turned on, is detected after a lighting test is performed on the plurality of the inorganic light emitting diodes 50 (S210), a partial region 61 of the encapsulation layer 60, which is placed on an upper surface of the defective inorganic light emitting diode 58, is removed (S220).

The removal of the partial region 61 of the encapsulation layer 60 may include radiating a laser beam 91 on the partial region 61 of the encapsulation layer 60. Specifically, referring to FIG. 11, a laser oscillator 90 may be moved to a region above the partial region 61 of the encapsulation layer 60 to radiate the laser beam 91.

When the partial region 61 of the encapsulation layer 60 located above the defective inorganic light emitting diode 58 is removed, the defective inorganic light emitting diode 58 is removed from the substrate 40 and a new replacement inorganic light emitting element 59 is mounted on that position (S230).

Alternatively, a new replacement inorganic light emitting diode 59 may be mounted in an adjacent area without removing the defective inorganic light emitting diode 58.

Next, heat is applied to the encapsulation layer 60 to remove defects in the encapsulation layer 60 (S240). When the heat is applied to the encapsulation layer 60, the viscoelasticity of the viscoelastic material of the encapsulation layer 60 is lowered and gains fluidity. Then the viscoelastic material flows, thereby removing the defects of the encapsulation layer 60. After the defect is removed, the viscoelastic material may be further heated or a hardener may be added, thereby curing the encapsulation layer 60, again.

Figure 16:
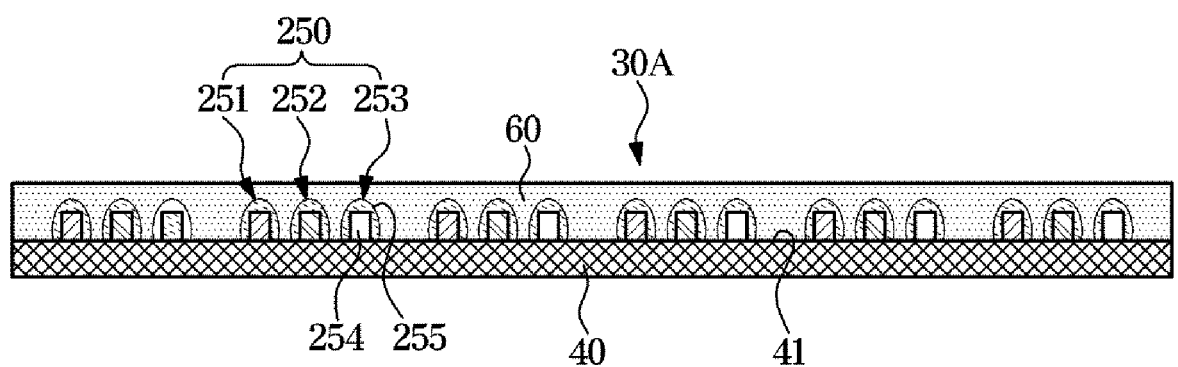
FIG. 16 is a cross-sectional view of a unit module of a display apparatus according to another embodiment.

FIG. 16 is a cross-sectional view of a unit module 30A of a display apparatus 1 according to another embodiment of the disclosure.

A unit module 30A of a display apparatus 1 according to another embodiment of the disclosure will be described with reference to FIG. 16. The same reference numerals are assigned to the same components as those of the above-described embodiment, and description thereof will be omitted.

Unlike the above-mentioned embodiment, each of the unit modules 30A-30L may include a substrate 40, and a plurality of inorganic light emitting diode packages 250 mounted on a mounting surface 41 of a substrate 40.

That is, according to the previous embodiment in FIG. 5-7, the plurality of inorganic light emitting diodes 50 are mounted on the substrate 40 without individual molding. According to another embodiment shown in FIG. 16, at least one inorganic light emitting diode 254 may be individually molded to form an inorganic light emitting diode packages 250 and then the inorganic light emitting diode packages 250 may be mounted on the substrate 40.

The inorganic light emitting diode package 250 may include the inorganic light emitting diode 254 and a molding resin 255 configured to individually surround the inorganic light emitting diode 254. The molding resin 255 may be formed of a transparent material. The inorganic light emitting diode packages 250 may include a red inorganic light emitting diode package 251, a green inorganic light emitting diode package 252, and a blue inorganic light emitting diode package 253.

On the substrate 40, an encapsulation layer 60 may be formed to physically protect the inorganic light emitting diode packages 250 without causing the optical distortion. The encapsulation layer 60 may include viscoelastic materials, which have the viscoelasticity and the degree of curing of the encapsulation layer 60 may vary according to changes in the temperature or the pressure being applied.

As is apparent from the above description, it may be possible to physically and safely protect a plurality of inorganic light emitting diodes mounted on a substrate and to improve the optical performance, thereby improving the image quality of the display apparatus.

When the plurality of inorganic light emitting diodes are encapsulated, the viscoelastic material is formed in the form of a film or a sheet and is laminated on the substrate. Thus it may be possible to simplify the encapsulation process. It may be possible to visually hide a seam between adjacent unit modules of the display apparatus and thus it may be possible to improve the display quality.

Therefore, it may be possible to smoothly assemble a large number of unit modules and thus it may be possible to provide a large screen size meeting the needs of consumers.

It may be possible to find a defective inorganic light emitting diode and to easily replace the defective inorganic light emitting diode although the encapsulation process on the inorganic light emitting diode is completed, thereby improving the durability and reliability of the display apparatus.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   a plurality of unit modules; and
   a cover configured to support the plurality of unit modules,
   wherein each of the plurality of unit modules comprises:
      a substrate;
      a plurality of inorganic light emitting diodes provided on a mounting surface of the substrate; and
      an encapsulation layer formed on the mounting surface of the substrate to cover the plurality of inorganic light emitting diodes and the mounting surface of the substrate,
   wherein the encapsulation layer comprises a viscoelastic material having varying viscoelasticity based on temperature being applied to the viscoelastic material, and
   wherein a seam between the plurality of unit modules adjacent to each other is visually hidden by applying heat to the encapsulation layer of the plurality of unit modules.

2. The display apparatus of claim 1, wherein based on the viscoelastic material being heated and reaching a predetermined temperature, the viscoelasticity of the viscoelastic material is lowered and the viscoelastic material gains fluidity.

3. The display apparatus of claim 1, wherein the viscoelastic material comprises at least one of ethylene based polymers, acetate based polymers, ethylene vinyl acetate based polymers, olefin based polymers or acrylic based polymers.

4. The display apparatus of claim 1, wherein the substrate comprises:
   a glass substrate; and
   a thin film transistor (TFT) layer formed on the glass substrate and configured to drive the plurality of inorganic light emitting diodes.

5. The display apparatus of claim 1, wherein the plurality of unit modules are arranged in a matrix.

6. The display apparatus of claim 1, further comprising a compensation layer formed on the encapsulation layer to improve flatness of the encapsulation layer.

7. The display apparatus of claim 1, further comprising a frame arranged between the plurality of unit modules and the cover and coupled to the plurality of unit modules.

8. The display apparatus of claim 1, wherein the viscoelastic material is formed in a film or a sheet and the film or the sheet is laminated onto the substrate.

9. The display apparatus of claim 8, wherein the viscoelastic material is laminated onto the substrate while heat and pressure are applied in a vacuum state.

10. A display apparatus comprising:
    a plurality of unit modules; and
    a cover configured to support the plurality of unit modules,
    wherein each of the plurality of unit modules comprises:
       a substrate;
       at least one inorganic light emitting diode package mounted on a mounting surface of the substrate, the at least one inorganic light emitting diode package comprising:
          an inorganic light emitting diode; and
          a molding resin configured to individually surround the inorganic light emitting diode; and
       an encapsulation layer formed on the mounting surface of the substrate to cover the at least one inorganic light emitting diode package and the mounting surface of the substrate,
    wherein the encapsulation layer comprises a viscoelastic material having varying viscoelasticity based on temperature being applied to the viscoelastic material, and
    wherein a seam between the plurality of unit modules adjacent to each other is visually hidden by applying heat to the encapsulation layer of the plurality of unit modules.

11. A display apparatus comprising:
    a first unit module comprising:
       a first substrate;
       a plurality of first inorganic light emitting diodes provided on a first mounting surface of the first substrate; and
       a first encapsulation layer formed on the first mounting surface of the first substrate to cover the plurality of first inorganic light emitting diodes and the first mounting surface of the first substrate;
    a second unit module, the first unit module and the second unit module being adjacent to each other and having a gap therebetween, the second unit module comprising:
       a second substrate;
       a plurality of second inorganic light emitting diodes provided on a second mounting surface of the second substrate; and
       a second encapsulation layer formed on the second mounting surface of the second substrate to cover the plurality of second inorganic light emitting diodes and the second mounting surface of the second substrate; and a cover configured to support the first and second unit modules, wherein a seam between the first unit module and the second unit module is visually hidden by varying viscoelasticity of each of the first and second encapsulation layers.

12. The display apparatus of claim 11, wherein based on a viscoelastic material of each of the first and second encapsulation layers being heated and reaching a predetermined temperature, the viscoelasticity of each of the first and second encapsulation layers is lowered and the viscoelastic material of each of the first and second encapsulation layers gains fluidity.

13. The display apparatus of claim 12, wherein the viscoelastic material of each of the first and second encapsulation layers comprises at least one of ethylene based polymers, acetate based polymers, ethylene vinyl acetate based polymers, olefin based polymers or acrylic based polymers.

14. The display apparatus of claim 11, further comprising a compensation layer formed on the first and second encapsulation layers to improve flatness of the first and second encapsulation layers.

15. A method of manufacturing a display apparatus comprising:

mounting a plurality of inorganic light emitting diodes on a mounting surface of a substrate;

forming an encapsulation layer comprising a viscoelastic material on the mounting surface of the substrate to cover the plurality of inorganic light emitting diodes and the mounting surface of the substrate;

assembling a plurality of unit modules including a first unit module and a second unit module to be adjacent to each other, each of the plurality of unit modules comprising the substrate, the plurality of inorganic light emitting diodes, and the encapsulation layer; and changing viscoelasticity of a first encapsulation layer of the first unit module and a second encapsulation layer of the second unit module to visually hide a seam between the first unit module and the second unit module.

16. The method of claim 15, wherein based on the viscoelastic material being heated and reaching a predetermined temperature, the viscoelasticity of the viscoelastic material is lowered and the viscoelastic material gains fluidity.

* * * * *